United States Patent [19]

Sekiguchi et al.

[11] Patent Number: 5,157,479
[45] Date of Patent: Oct. 20, 1992

[54] SEMICONDUCTOR DEVICE BEING CAPABLE OF IMPROVING THE PACKING DENSITY WITH A HIGH HEAT RADIATION CHARACTERISTICS

[75] Inventors: Takeshi Sekiguchi; Masanori Nishiguchi, both of Yokohama, Japan

[73] Assignee: Sumitomo Electric Industries, Ltd., Osaka, Japan

[21] Appl. No.: 536,079

[22] Filed: Jun. 8, 1990

Related U.S. Application Data

[63] Continuation of Ser. No. 187,004, Apr. 27, 1988, abandoned.

[30] Foreign Application Priority Data

Apr. 28, 1987 [JP] Japan .................. 62-105263

[51] Int. Cl.⁵ .................................. H01L 23/02
[52] U.S. Cl. ................................ 357/74; 357/55; 357/67; 357/68; 357/81
[58] Field of Search ............ 357/67, 81, 68, 56, 357/59, 74, 55, 80

[56] References Cited

U.S. PATENT DOCUMENTS

| | | | |
|---|---|---|---|
| 4,246,595 | 1/1981 | Noyori et al. | 357/55 |
| 4,672,417 | 6/1987 | Sugiyama et al. | 357/67 |
| 4,692,791 | 9/1987 | Bayraktaroglu | 357/56 |
| 4,724,472 | 2/1988 | Sugimoto et al. | 357/74 |
| 4,866,501 | 9/1989 | Shanefield | 357/55 |

FOREIGN PATENT DOCUMENTS

| | | | |
|---|---|---|---|
| 52-29272 | 4/1977 | Japan | 357/55 |
| 54-23388 | 2/1979 | Japan | 357/55 |
| 57-112056 | 7/1982 | Japan | 357/74 |
| 58-143556 | 8/1983 | Japan | 357/55 |
| 59-107554 | 6/1984 | Japan | 357/74 |
| 60-167358 | 1/1986 | Japan | 357/74 |
| 61-74354 | 4/1986 | Japan | 357/74 |
| 2136205 | 9/1984 | United Kingdom | 357/74 |

OTHER PUBLICATIONS

IBM Technical Disclosure Bulletin, vol. 14, No. 11, Apr. 1972, "Replaceable chip to heat sink connection on circuit Boards", by W. E. Dunkel, p. 3332.
R. W. Johnson et al., "Silicon Hybrid Wafer-Scale Package Technology", IEEE Journal of Solid-State Circuits, vol. SC-21, No. 5, Oct. 1986, pp. 845-851.

Primary Examiner—Rolf Hille
Assistant Examiner—Steven Loke
Attorney, Agent, or Firm—Cushman, Darby & Cushman

[57] ABSTRACT

A silicon substrate having a thin film circuit layer formed on the surface of the substrate is laid on a metallic base and a semiconductor chip made of compound semiconductor such as gallium arsenide is disposed in a hole defined in the central portion of the silicon substrate so that the semiconductor chip can be directly fixed to the metallic base for dissipating the heat of the semiconductor chip. The connecting terminals of the semiconductor chip are connected to thin film circuit layer formed on the surface of the silicon substrate through wires. The heat generated in the semiconductor chip can be transmitted to the metallic base so that the heat is effectively dissipated.

10 Claims, 3 Drawing Sheets

SEMICONDUCTOR DEVICE BEING CAPABLE OF IMPROVING THE PACKING DENSITY WITH A HIGH HEAT RADIATION CHARACTERISTICS

This is a continuation of application No. 07/187,004, filed on Apr. 27, 1988 and abandoned.

BACKGROUND OF THE INVENTION

1. Field of the Invention

The present invention relates to a semiconductor device, and more particularly to a compound semiconductor device of high operation speed such as a gallium arsenide transistor.

2. Description of the Prior Art

There have been used gallium arsenide semiconductor devices for a high speed signal processing in a high frequency band such as the GHz band.

As shown in FIG. 1(a), there is disposed a gallium arsenide semiconductor chip 3 in a concave portion 2 provided in the central portion of a base 1 made of ceramics such as alumina, and electrodes (not shown) on the gallium arsenide semiconductor chip 3 are connected to terminals formed in a thick film printed circuit patterns 4 on the peripheral portion of the concave portion 2 on the base 1 through bonding wires 5 made of aurum material for example.

However, the surface of the ceramic base 1 for mounting the gallium arsenide chip 3 is so rough that it is difficult to form a circuit with high precision. In order to form circuit patterns on the rough surface of the base, the minimum width of the thick film printed circuit 4 must be approximately 100 μm, making it impossible to form the circuit patterns with a high density. Particularly, since it is difficult to form ground conductors for isolation, impedance matching can not be made, so that the degrees of the freedom of the circuit patterns are few.

Another example of a packaging type of a conventional semiconductor device is shown in FIG. 1(b), in which there are formed thin film circuit patterns 12 on the flat upper surface of a ceramic base 11, and the thin film circuit patterns 12 are connected through wires 14 to a gallium arsenide semiconductor chip 13 which is secured on the surface of the base 11 in its central portion by die-bonding.

Even in this case, however, because of using ceramic material as the base 11, the minimum width of each of the thin film circuit patterns 12 may be decreased only up to approximately 10 μm. While an integral multi layer film circuit patterns can not be formed on the ceramic base 11. Therefore, the arrangement shown in FIG. 1(b) is not suitable for high density mounting.

A further example of a packaging type of a conventional semiconductor device is shown in FIG. 1(c), in which there is die-bonded a gallium arsenide semiconductor chip 23 in the central portion of the upper surface of a silicon substrate 21 having thin film circuit patterns 22 formed on the surface of the silicon substrate 21. The thin film circuit patterns 22 are connected to the gallium arsenide chip 23 through wires 24. In this case, since the flatness of the surface of the silicon substrate 21 is remarkably improved because of using a silicon substrate, the minimum width of the thin film circuit patterns 22 may be approximately 3 μm.

However, in any case as mentioned above, the heat discharging characteristic of the semiconductor device is not inferior. Generally, there is generated a large amount of heat in the semiconductor device during an operation in a high frequency of more than 500 MHz, and since the generated heat can not be sufficiently radiated in the conventional semiconductor device, the frequency characteristic of the semiconductor device is badly effected by the heat, so that the conventional semiconductor device is not suitable to a high frequency operation. In addition, there is a problem that an arrangement for improving the heat radiation characteristic is apt to deteriorate the packing density of the semiconductor device.

SUMMARY OF THE INVENTION

An object of the present invention is to provide a semiconductor device being capable of improving the packing density, with a high heat radiation characteristic and good operating characteristic in a high frequency band such as the microwave region.

The semiconductor device according to the present invention is characterized in that, a silicon substrate having a recess defined in the central portion thereof is fixed on the surface of a metallic base for radiating heat. A thin film conductor patterns are formed on the surface of the peripheral portions of the substrate and a compound semiconductor chip made of such as gallium arsenide is disposed in the recess and electrodes of the compound semiconductor chip are connected to the thin film circuit patterns through wires.

Since the semiconductor device according to the present invention is constituted as described above, the heat generated in the compound semiconductor chip is transmitted to the metallic base and can be effectively radiated. Thus the temperature rising of the semiconductor chip can be effectively suppressed by the heat radiation through the metallic base. Moreover, the thin film circuit patterns are precisely formed in the peripheral portion of the silicon substrate surrounding the compound semiconductor chip on the silicon substrate, so that the width of the thin film circuit patterns can be decreased, the package density of the semiconductor device can be increased.

DETAILED DESCRIPTION OF THE PREFERRED EMBODIMENT

Figure 1A:
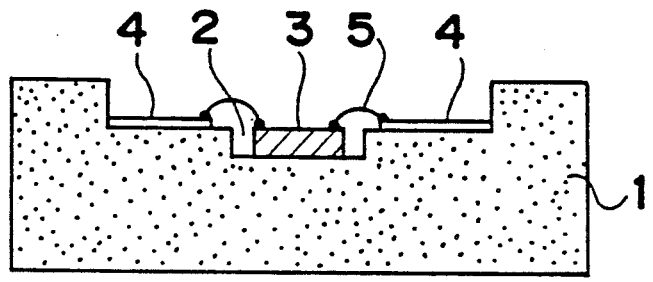
FIG. 1 is a sectional view showing a structure of a conventional gallium arsenic semiconductor device.
Figure 1B:
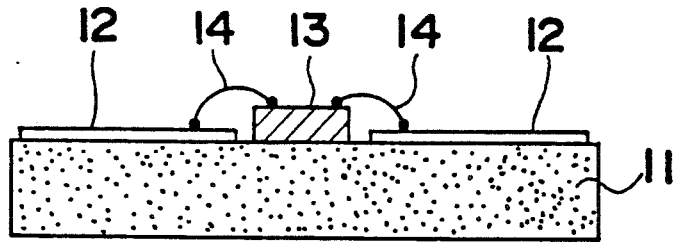
Figure 1C:
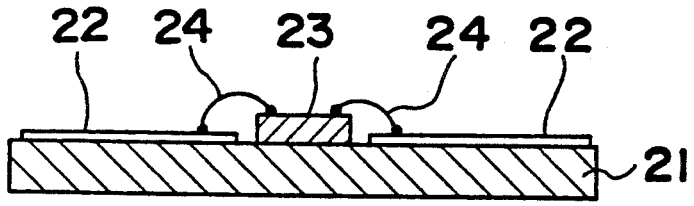

An example of a semiconductor device according to the present invention will be explained with reference to the attached drawings as follows. In the explanation of the drawings, like parts are represented by the same reference numerals and the redundant explanations are omitted.

Figure 2:
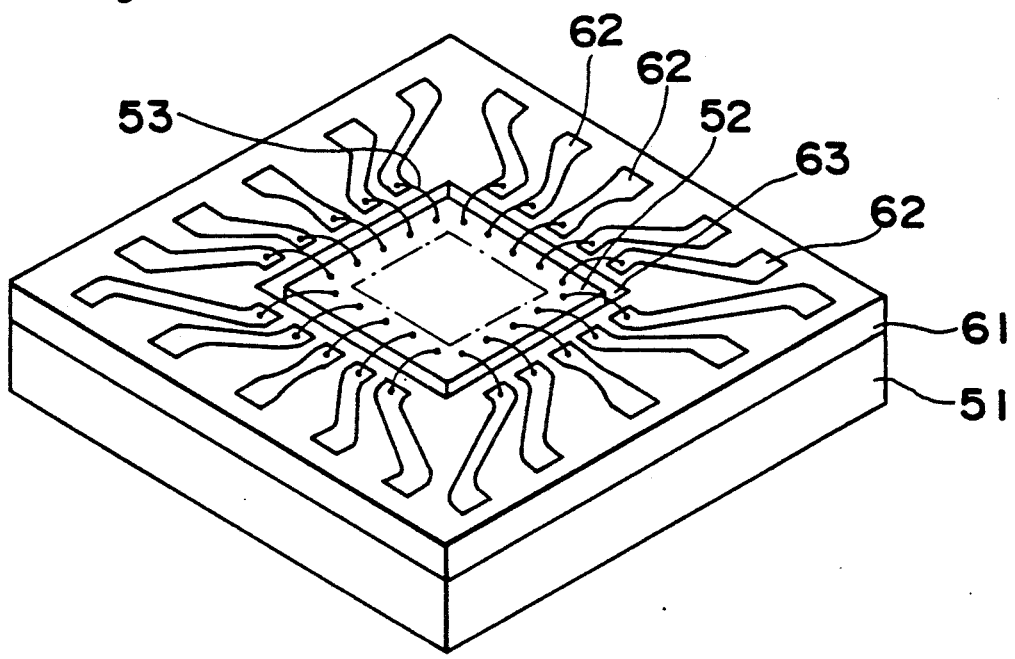
FIGS. 2 and 3 are perspective views showing examples of a semiconductor device according to the present invention.
Figure 4:
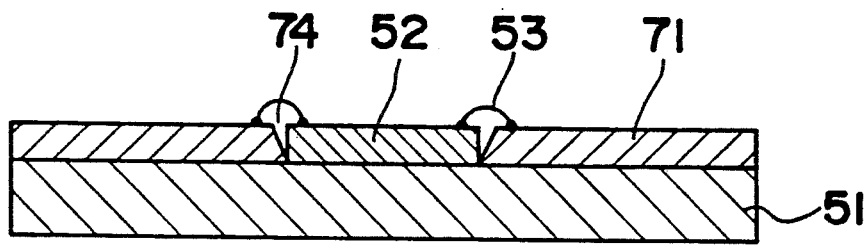
FIG. 4 is a sectional view showing a center portion of the semiconductor device shown in FIG. 3.

As shown in FIGS. 2 and 4, a silicon substrate 61 of a generally rectangular shape is secured on the surface of a metallic base 51 made of copper-tungsten alloy including tungsten 20% and copper 80% for example so as to facilitate heat radiation or heat dissipation of a semiconductor chip 52 disposed on the silicon substrate 51. The coefficient of thermal expansion of the copper-tungsten alloy is $6.9 \times 10^{-9\circ} C.^{-1}$, which is approximately equal to that of gallium arsenide. Moreover, since the copper-tungsten alloy has a large coefficient of thermal conductivity of $2.8 W/cm^\circ C.$, the copper-tungsten alloy is peculiarly suitable to the semiconductor device according to the present invention.

Figure 3:
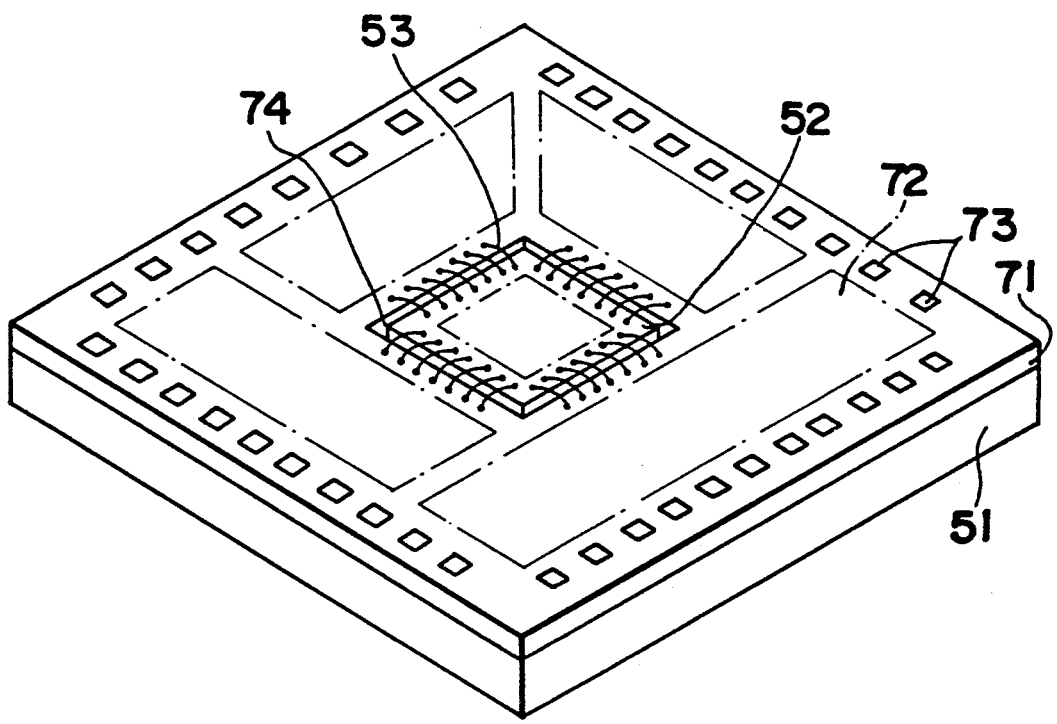

There is defined a rectangular hole 63 at the central portion of the silicon substrate 61. A compound semiconductor chip such as a gallium arsenide semiconductor chip 52 having an integrated circuit is accommodated in the hole 63 and directly fixed on the surface of the metallic base 51. There are formed a plurality of connecting patterns 62 extending radially on the surface of the silicon substrate 61 in the peripheral portions around the hole 63. Each of the electrodes (not shown) of the gallium arsenide semiconductor chip 52 are connected to the connecting patterns 62 through wires 53. Another embodiment of the semiconductor device shown in FIG. 3 uses a silicon substrate 71 secured onto the metallic base 51 similarly to the case shown in FIG. 2. The silicon substrate 71 comprises a circuit area 72 in which a multilayer printed circuit is formed for connecting the terminals of the gallium arsenide semiconductor chip 52 and electrodes 73 disposed on the surface of the substrate 71 at the peripheral edge portion thereof. There may be provided a circuit arrangement of passive elements such as capacitors or resistors, or active elements such as transistors in the circuit area 72. Provision of such passive circuit and/or active circuit may increase kinds of operation of the semiconductor device. Such circuit arrangement may be suitable for a device operating in a low frequency zone.

In the constitution as described above, since the gallium arsenide semiconductor chip 52 is directly attached to the metallic base 51, the heat generated in the chip 52 can be dissipated through the metallic base 51 efficiently. Moreover, since it is possible to form a circuit with high density on the silicon substrate, the packing density of the circuit can be increased up to the limit of the wire-bonding.

The process of manufacturing the semiconductor device as described above will be explained with reference to FIG. 5.

Figure 5A:
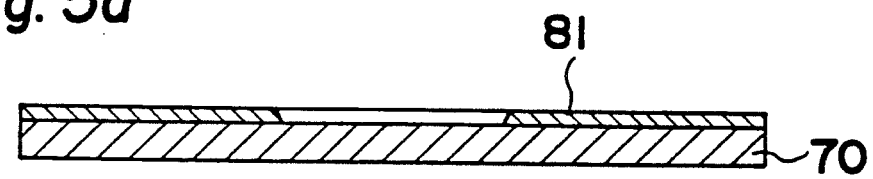
FIG. 5 is a sectional view showing each process of manufacturing a semiconductor device according to the present invention.
Figure 5B:
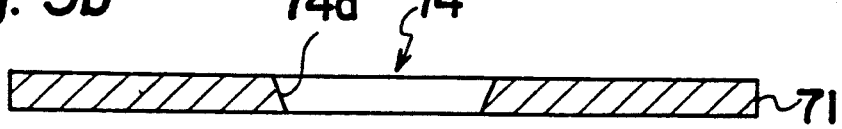
Figure 5C:
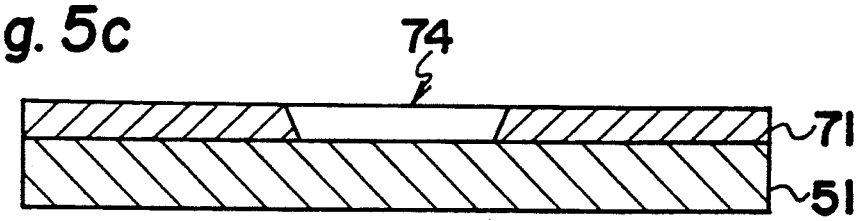

First, there is prepared a silicon substrate 70 whose surface is a crystal orientation (100) surface having a connecting circuit (not shown) in a predetermined pattern formed on or below the surface of the substrate 70, then a mask layer 81 is formed on the surface of the substrate 70 by patterning. Subsequently, a predetermined area of the substrate corresponding to the hole portion is etched with etchant of mixed liquid including ethylenediamine, pyrocatechol and water as shown in FIG. 5(a), whereby a hole portion 74 with a side wall 74a of crystal orientation (111) inclined at an angle of 54.7° to the horizontal surface is formed as shown in FIG. 5(b). After that, the silicon substrate 71 obtained as described above is die-bonded onto the metallic base 51 in a known method as shown in FIG. 5(c).

Figure 5D:
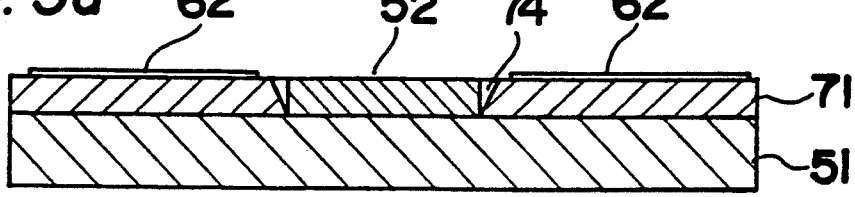

Subsequently, the gallium arsenide semiconductor chip 52 is disposed in the hole 74 and die-bonded onto the metallic base 51 as shown in FIG. 5(d). In this example, since the thickness of the gallium arsenide semiconductor chip 52 is equal to the thickness of the silicon substrate 71, the levels of the both surfaces of the chip 52 and of the substrate 71 are coincided, thereby facilitating the subsequent wire-bonding work.

Subsequently, the electrodes on the gallium arsenide semiconductor chip 52 are connected to the connecting patterns 62 on the silicon substrate 51 by wire-bonding and the chip 52 and the substrate 51 with the circuit formed thereon are accommodated in a predetermined form, whereby a semiconductor device can be made.

It is obvious to those skilled in the art that the present invention is not limited to the above mentioned embodiments and that various modifications may be made.

For example, in the present invention, though the etchant of ethylenediamine group is used for forming the hole portion, etchant of hydrazine group or aqueous solution of potassium hydroxide may be also used, and the material of the mask may be selected among photo resist, silicon dioxide and silicon nitride, for example, in accordance with the materials of the etchant.

Moreover, the material of the metallic base for dissipating heat is not limited to the copper-tungsten alloy as described in the embodiment and any material having a large coefficient of thermal conductivity and coefficient of thermal expansion approximate to that of gallium arsenic can be used. Moreover, though the circuit layer of the silicon substrate is formed on the surface of the substrate, an integral multi-pack film may be also formed.

Furthermore, the surface of the silicon substrate is not limited to a crystal orientation (100) and when the surface of the silicon substrate is made to be a crystal orientation (110), a hole portion with a side wall vertical to the horizontal surface can be formed by etching process.

As described above in detail, in the semiconductor device according to the present invention, the silicon substrate with a circuit is fixed onto the metallic base for dissipating heat and since a compound semiconductor chip is fixed onto the metallic base for discharging heat in the hole portion formed in the silicon substrate, the heat generated in the compound semiconductor chip can be efficiently discharged well and since it is possible to form a circuit with high density on the surface of the silicon substrate, there is an effect that a semiconductor device having a circuit with high density can be realized.

What is claimed is:
1. A semiconductor device comprising:
   a metallic base,
   a silicon substrate over said metallic base, and having a plurality of connecting circuit patterns formed on a top surface of the substrate and a hole defined in a central portion of the substrate which is open at its bottom so that a top surface of said metallic base forms a flat bottom wall of said hole, and which has tapered wall members extending upward from edges of said bottom wall to define edges of said hole such that said hole expands in size from bottom to top,
   a semiconductor chip made of gallium arsenide disposed in the hole of the silicon substrate, at least part of said semiconductor chip being below said top surface of the silicon substrate and a top surface of said semiconductor chip being substantially coplanar with said top surface of said silicon substrate, said semiconductor chip being fixed directly to said metallic base with a bottom corner of said semiconductor chip contacting substantially an edge of said bottom wall,
   a plurality of wires, each connecting one of said connecting circuit patterns to contacting areas on said top surface of the semiconductor chip to form a complex integrated circuit of gallium arsenide and silicon integrated circuits.

2. The semiconductor device according to claim 1, wherein said metallic base has a coefficient of thermal expansion approximately that of gallium arsenide.

3. The semiconductor device according to claim 2, wherein said metallic base is made of a copper-tungsten alloy.

4. The semiconductor device according to claim 1, wherein side walls defining said hole is a crystal orientation (111) surface which is inclined at an angle of 54.7° to the horizontal surface.

5. The semiconductor device as in claim 1 wherein said metallic base and said silicon substrate have substantially same outer dimensions.

6. The semiconductor device as in claim 1 wherein said semiconductor chip has two bottom edge corners, each of which contacts substantially one of said edges of said hole.

7. A semiconductor assembly comprising:
a metallic base;
a silicon substrate formed on said metallic base including means for conducting signals to and from a central portion thereof, and having a hole defined in said central portion thereof, said hole being open at its bottom so that a top surface of said metallic base forms a bottom wall of said hole, and having two tapered side walls, which meet said bottom wall at respective edges and taper such that a top of said hole is larger than a bottom of said hole;
a semiconductor chip, disposed in the hole of the silicon substrate, and directly on said metallic base, said semiconductor chip having a top surface which is substantially co-planar with a top surface of said silicon substrate and a bottom surface with an edge that contacts substantially an edge of said hole; and
at least one wire, connecting said means for conducting signals to said semiconductor chip.

8. The semiconductor assembly as in claim 7 wherein said metallic base and said silicon substrate have substantially same outer dimensions.

9. The semiconductor assembly as in claim 7, wherein said metallic base is a structural member.

10. The semiconductor assembly as in claim 7 wherein said semiconductor chip has two bottom edge corners, each of which contacts substantially one of said edges of said hole.

* * * * *